(12) United States Patent
Hoeks et al.

(10) Patent No.: US 9,594,304 B2
(45) Date of Patent: Mar. 14, 2017

(54) LITHOGRAPHY APPARATUS, A DEVICE MANUFACTURING METHOD, A METHOD OF MANUFACTURING AN ATTENUATOR

(71) Applicant: ASML Netherlands B.V., Veldhoven (NL)

(72) Inventors: Martinus Hendricus Henricus Hoeks, Breugel (NL); Arno Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 144 days.

(21) Appl. No.: 14/382,229

(22) PCT Filed: Feb. 5, 2013

(86) PCT No.: PCT/EP2013/052199
§ 371 (c)(1),
(2) Date: Aug. 29, 2014

(87) PCT Pub. No.: WO2013/143729
PCT Pub. Date: Oct. 3, 2013

(65) Prior Publication Data
US 2015/0062547 A1 Mar. 5, 2015

Related U.S. Application Data

(60) Provisional application No. 61/618,315, filed on Mar. 30, 2012.

(51) Int. Cl.
*G03F 7/20* (2006.01)

(52) U.S. Cl.
CPC ............... *G03F 7/20* (2013.01); *G03F 7/704* (2013.01); *G03F 7/70191* (2013.01);
(Continued)

(58) Field of Classification Search
None
See application file for complete search history.

(56) References Cited

U.S. PATENT DOCUMENTS

| 7,133,118 B2 | 11/2006 | Gui et al. |
| 2005/0008280 A1 | 1/2005 | Howley |

(Continued)

FOREIGN PATENT DOCUMENTS

| JP | 2005-236292 A | 9/2005 |
| JP | 2007-156111 A | 6/2007 |

(Continued)

OTHER PUBLICATIONS

English-Language Abstract for Japanese Patent Publication No. 2007-156111 A, published Jun. 21, 2007; 1 page.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

There is disclosed an exposure apparatus, a device manufacturing method and a method of manufacturing an attenuator. According to an embodiment, the exposure apparatus includes a programmable patterning device configured to provide a plurality of individually controllable radiation beams; a projection system configured to project each of the radiation beams onto a respective location on a target; and an attenuator configured to reduce a standard deviation in maximum radiation flux or background exposure level that can be applied to the target by the radiation beams as a function of position on the target.

19 Claims, 7 Drawing Sheets

(52) U.S. Cl.
CPC ...... *G03F 7/70275* (2013.01); *G03F 7/70291* (2013.01); *G03F 7/70391* (2013.01)

(56) References Cited

U.S. PATENT DOCUMENTS

| | | | |
|---|---|---|---|
| 2006/0097199 A1* | 5/2006 | Veen | G03F 7/70191 |
| | | | 250/492.23 |
| 2009/0059189 A1* | 3/2009 | Goehnermeier | G03F 1/62 |
| | | | 355/30 |
| 2009/0213353 A1 | 8/2009 | Gui et al. | |
| 2010/0039630 A1 | 2/2010 | Michaloski | |
| 2011/0188016 A1 | 8/2011 | De Jager et al. | |
| 2014/0071421 A1 | 3/2014 | De Jager et al. | |
| 2014/0160452 A1 | 6/2014 | De Jager et al. | |

FOREIGN PATENT DOCUMENTS

| | | |
|---|---|---|
| WO | WO 2010/032224 A2 | 3/2010 |
| WO | WO 2011/104176 A1 | 9/2011 |

OTHER PUBLICATIONS

International Search Report directed to related International Patent Application No. PCT/EP2013/052199, mailed Jul. 10, 2013; 5 pages.
International Preliminary Report on Patentability and Written Opinion of the International Searching Authority directed to related International Patent Application No. PCT/EP2013/052199, issued Oct. 1, 2014; 10 pages.

* cited by examiner

LITHOGRAPHY APPARATUS, A DEVICE MANUFACTURING METHOD, A METHOD OF MANUFACTURING AN ATTENUATOR

CROSS-REFERENCE TO RELATED APPLICATIONS

This application claims the benefit of U.S. provisional application 61/618,315, which was filed on 30 Mar. 2012, and which is incorporated herein in its entirety by reference.

FIELD

The present invention relates to a lithography or exposure apparatus, a device manufacturing method and a method of manufacturing an attenuator.

BACKGROUND

A lithographic or exposure apparatus is a machine that applies a desired pattern onto a substrate or part of a substrate. The apparatus may be used, for example, in the manufacture of integrated circuits (ICs), flat panel displays and other devices or structures having fine features. In a conventional lithographic or exposure apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices and the like. A programmable patterning device could also be formed from an electro-optical deflector, configured for example to move spots of radiation projected onto a target (e.g., the substrate) or to intermittently direct a radiation beam away from the target (e.g., the substrate), for example to a radiation beam absorber. In either such arrangement, the radiation beam may be continuous.

SUMMARY

The maskless system may project radiation beams onto a target in a non-uniform manner at the target (e.g., substrate) level. For example, the nominal positions of the radiation beams at target level may form a grid having a density that varies as a function of position. The superposition of paths traced by the radiation beams at target level may form a pattern having varying density. Such non-uniformity may reduce the quality, for example contrast, in a radiation dose pattern formed on the target.

It is desirable, for example, to improve the quality of the dose pattern formed on the target.

According to an embodiment, there is provided an exposure apparatus, comprising: a programmable patterning device configured to provide a plurality of individually controllable radiation beams; a projection system configured to project each of the radiation beams onto a respective location on a target; and an attenuator configured to reduce a standard deviation in the maximum radiation flux or background exposure level that can be applied to the target by the radiation beams as a function of position on the target.

According to an embodiment, there is provided A device manufacturing method, comprising: using a programmable patterning device to provide a plurality of individually controllable radiation beams; projecting each of the radiation beams onto a respective location on a target; and using an attenuator to reduce a standard deviation in maximum radiation flux or background exposure level that can be applied to the target by the radiation beams as a function of position on the target.

According to an embodiment, there is provided a method of manufacturing an attenuator in an apparatus, the apparatus comprising a programmable patterning device configured to provide a plurality of individually controllable radiation beams and a projection system configured to project each of the radiation beams onto a respective location on a target, wherein the projection system is configured to direct each radiation beam onto its respective location by controlling the position of the radiation beam relative to a field lens in the optical path from a source of the radiation beam to the respective location, the method comprising: providing an environment that promotes deposition of a radiation attenuating substance on a surface exposed to the radiation beam; and using the programmable patterning device to expose a surface of the field lens so as to produce a distribution of the radiation attenuating substance on a surface of the field lens that provides a desired attenuating property.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to an apparatus that may include a programmable patterning device that may, for example, be comprised of an array or arrays of self-emissive contrast devices. Further information regarding such an apparatus may be found in PCT patent application publication no. WO 2010/032224 A2, U.S. patent application publication No. US 2011-0188016, U.S. patent application No. US61/473,636 and U.S. patent application No. 61/524,190 which are hereby incorporated by reference in their entireties. An embodiment of the present invention, however, may be used with any form of programmable patterning device including, for example, those discussed above.

Figure 1:
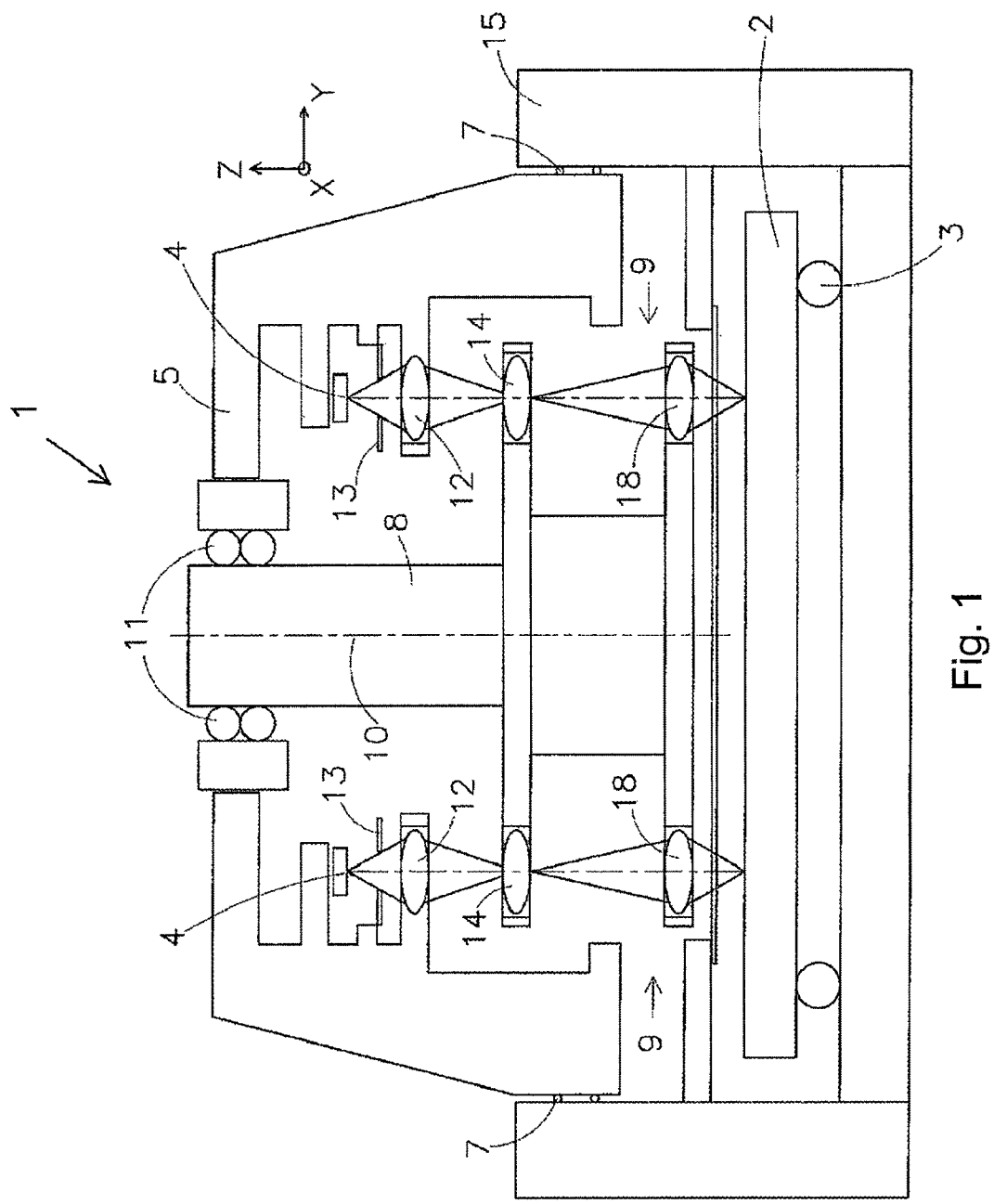
FIG. 1 depicts a part of a lithographic or exposure apparatus according to an embodiment of the invention.

FIG. 1 schematically depicts a schematic cross-sectional side view of a part of a lithographic or exposure apparatus. In this embodiment, the apparatus has individually controllable elements substantially stationary in the X-Y plane as discussed further below although it need not be the case. The apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 1 further comprises a plurality of individually controllable self-emissive contrast devices 4 configured to emit a plurality of beams. In an embodiment, the self-emissive contrast device 4 is a radiation emitter, e.g. a radiation emitting diode, such as a light emitting diode (LED), an organic LED (OLED), a polymer LED (PLED), a fiber laser or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-250 mW, and optionally an output power of at least 50 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
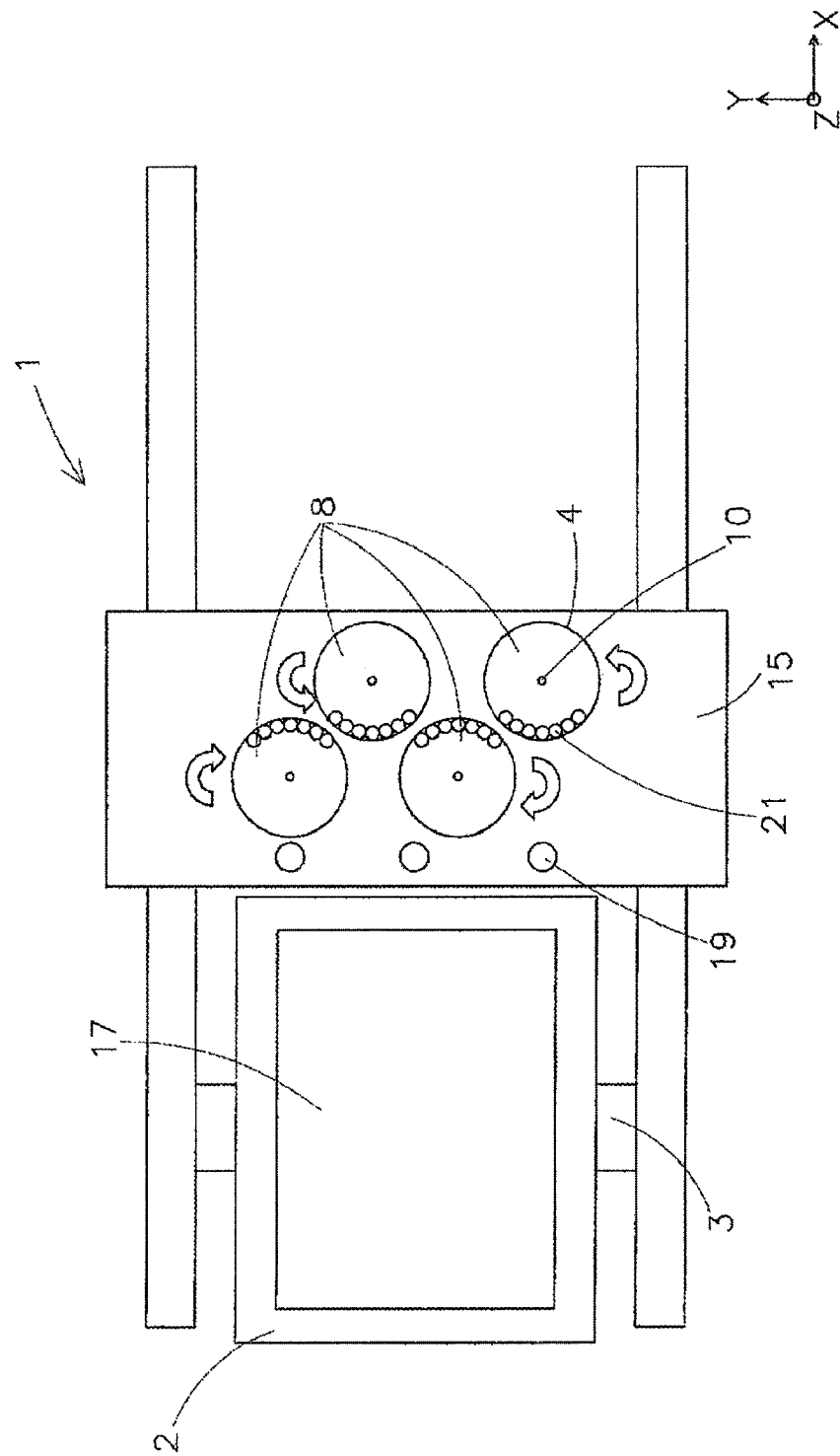
FIG. 2 depicts a top view of a part of the apparatus of FIG. 1 according to an embodiment of the invention.

The self-emissive contrast devices 4 are arranged on a frame 5 and may extend along the Y-direction and/or the X direction. While one frame 5 is shown, the apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of, e.g., the substrate. The self-emissive contrast device 4 and the projection system form an optical column. The apparatus 1 may comprise an actuator (e.g. motor) 11 to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator (e.g. motor) 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4 or of an adjacent lens 12 and a self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on, e.g., the substrate is scanned over a portion of the substrate. By simultaneously moving the substrate on the substrate table 2 underneath the optical column, the portion of the substrate 17, which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the apparatus of FIG. 1 having self-emissive contrast devices 4. Like the apparatus 1 shown in FIG. 1, the apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
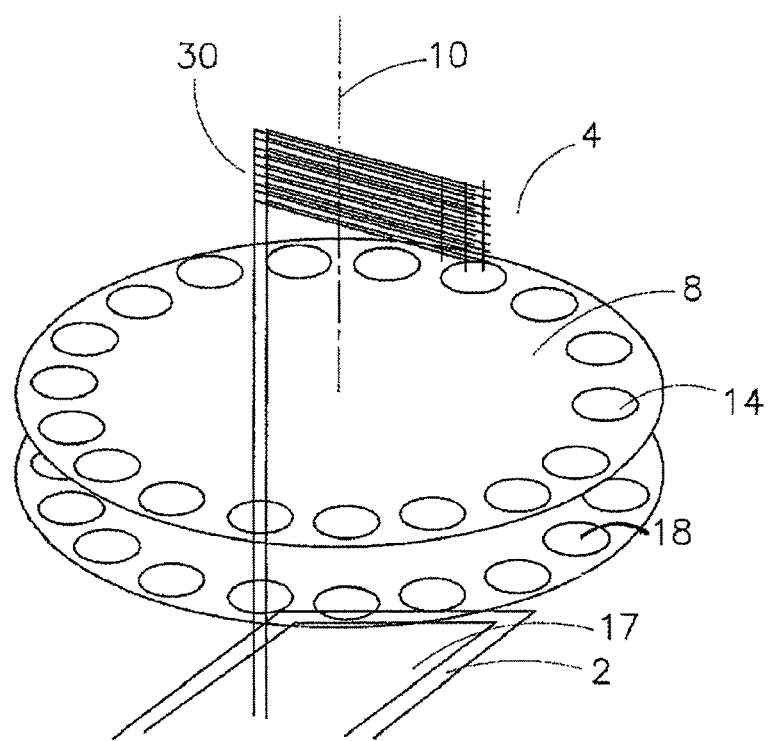
FIG. 3 depicts a highly schematic, perspective view of a part of a lithographic or exposure apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of, e.g., the substrate 17 held by the substrate table 2. In an embodiment, the plurality of beams is arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

As the rotatable frame rotates, the beams are incident on successive lenses. Each time a lens is irradiated by the beams, the places where the beam is incident on a surface of the lens, moves. Since the beams are projected on the target differently (with e.g. a different deflection) depending on the place of incidence of the beams on the lens, the beams (when reaching the target) will make a scanning movement with each passage of a following lens. This principle is further explained with reference to FIG. 4.

Figure 4:
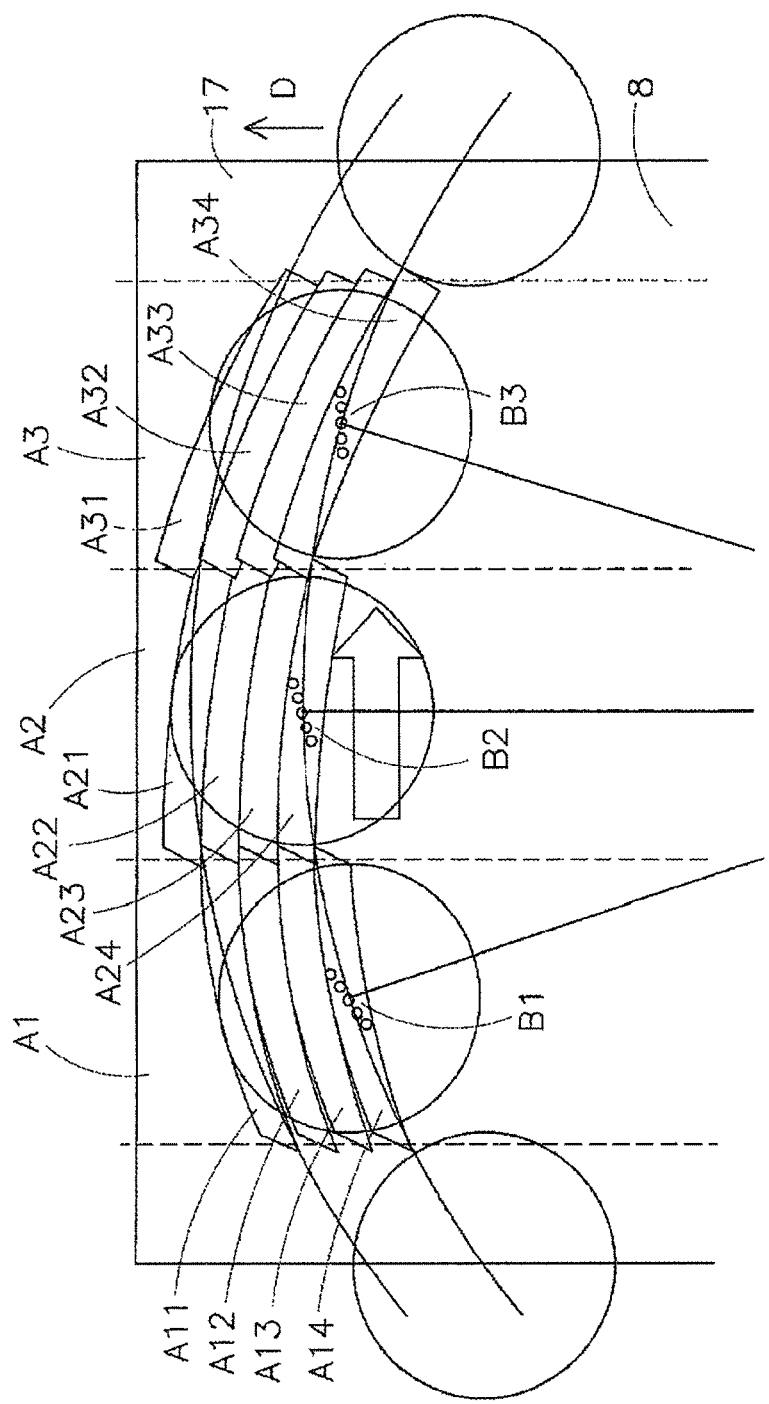
FIG. 4 depicts a schematic top view of projections by the apparatus according to FIG. 3 onto a target according to an embodiment of the invention.

FIG. 4 depicts a highly schematic top view of a part of the rotatable frame 8. A first set of beams is denoted by B1. A second set of beams is denoted by B2. A third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D. The direction D may be along the X axis as depicted in FIG. 2. The direction D may be substantially perpendicular to the scanning direction of the beams in the areas A14, A24, A34.

As a result of the movement in direction D by a second actuator (e.g. a movement of the substrate table by a corresponding substrate table motor), successive scans of the beams when being projected by successive lenses of the rotatable frame 8, are projected so as to substantially abut each other. This results in substantially abutting areas A11, A12, A13, A14 (areas A11, A12, A13 being previously scanned and A14 being currently scanned as shown in FIG. 4) for each successive scan of beams B1. Areas A21, A22, A23 and A24 (areas A21, A22, A23 being previously scanned and A24 being currently scanned as shown in FIG. 4) are for beams B2. Areas A31, A32, A33 and A34 (areas A31, A32, A33 being previously scanned and A34 being currently scanned as shown in FIG. 4) are for beams B3. Thereby, the areas A1, A2 and A3 of the substrate surface may be covered with a movement of the substrate in the direction D while rotating the rotatable frame 8.

The projecting of multiple beams through a same lens allows processing of a whole substrate in a shorter timeframe (at a same rotating speed of the rotatable frame 8). This is because for each passing of a lens, a plurality of beams scan the substrate 17 with each lens. This allows increased displacement in the direction D for successive scans. Viewed differently, for a given processing time, the rotating speed of the rotatable frame may be reduced when multiple beams are projected onto the substrate via a same lens. This possibly reduces effects such as deformation of the rotatable frame, wear, vibrations, turbulence, etc. due to high rotating speed.

In an embodiment, the plurality of beams is arranged at an angle to the tangent of the rotation of the lenses 14, 18 as shown in FIG. 4. In an embodiment, the plurality of beams is arranged such that each beam overlaps or abuts a scanning path of an adjacent beam.

A further effect of the aspect that multiple beams are projected at a time by the same lens may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers. Each of the beams is incident on a respective one of the fibers. The fibers are arranged so as to reduce a spacing between the beams along an optical path. As a result the beam spacing downstream of the optical fibers is less than the beam spacing upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) by a laser induced material transfer.

Figure 5:
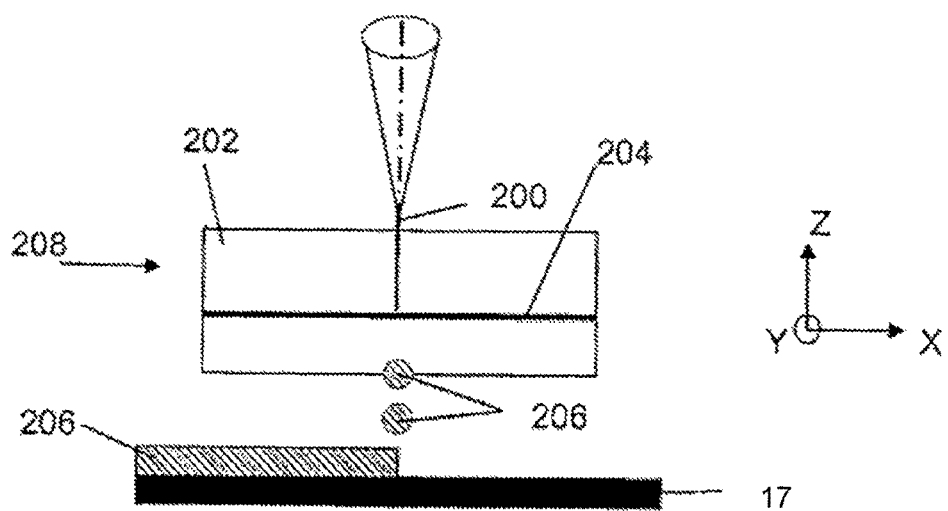
FIG. 5 depicts in cross-section, a part of an embodiment of the invention.

Referring to FIG. 5, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

The quality of a dose pattern formed on the target may be reduced by non-uniform performance of the exposure apparatus at target (e.g., substrate) level, e.g., due to non-uniform performance of a programmable patterning device, of a projection system, or of a combination of programmable patterning device and projection system. Such non-uniform performance can arise where the background exposure level is non-uniform for example. This can occur for example when the programmable patterning device uses self-emissive contrast elements that benefit from being driven constantly but which do not contribute uniformly to illuminating the target.

In an embodiment, the self-emissive contrast elements comprise laser diodes. Laser diodes start "lasering" above a certain threshold current. The threshold current may be about 1 to 2% of maximum current, for example. Below the threshold current the laser diode acts like an LED or is off. In an embodiment the laser diodes are maintained above the threshold current in order to avoid timing errors associated with the stochastic starting of the laser mode. Such timing errors can be of the order of 200 ps or greater, which could lead to spot position errors of 20 nm or greater.

Maintaining laser diodes above the threshold current avoids timing errors but means that the laser diodes all contribute to a background exposure. Where the laser diodes contribute in a non-uniform manner to the dose distribution formed on the target, the background exposure will also be non-uniform.

Figure 6:
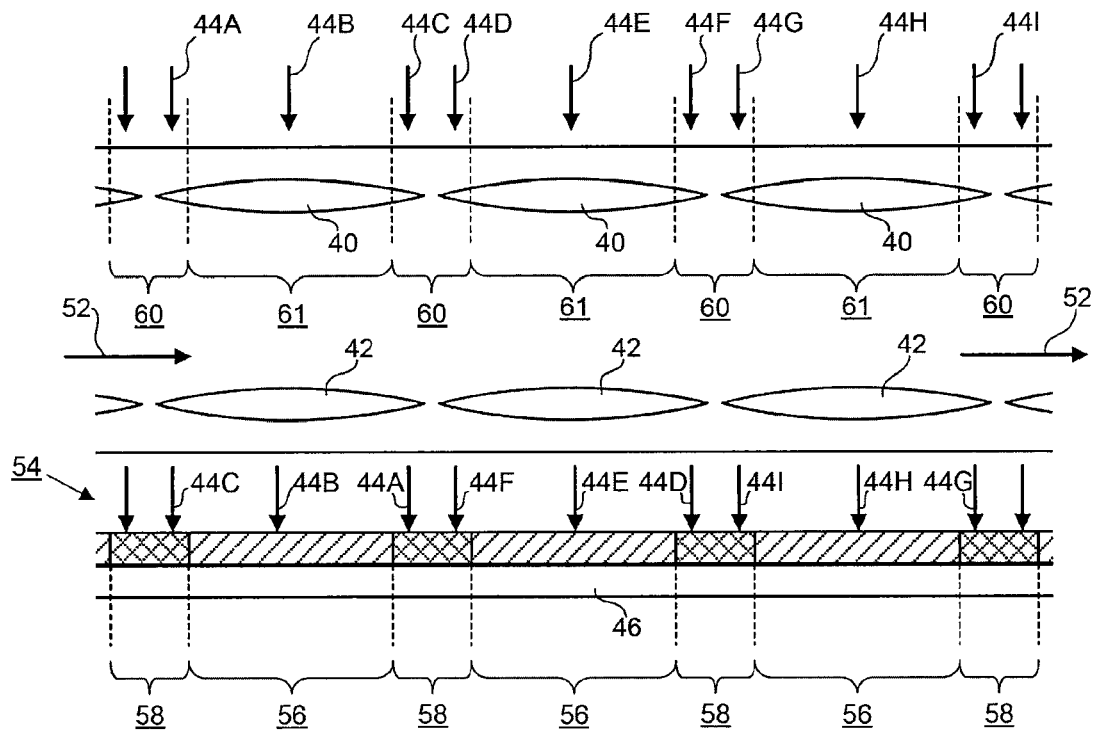
FIG. 6 depicts schematically the propagation of radiation beams through peripheral regions of field lenses onto stitching regions between exposure segments.

FIG. 6 depicts schematically an example situation in which such a non-uniform background exposure may occur. FIG. 6 depicts a portion of a projection system that comprises field lenses 40 and imaging lenses 42. The lenses are mounted on a rotatable frame 8. Rotation of the frame 8 causes the field lenses 40 and imaging lenses 42 to be scanned (arrows 52) underneath radiation beams 44A to 44I. The positions at which the radiation beams 44A to 44I intersect the field lenses 40 determines the positions at which the radiation beams will be incident on the target (e.g., substrate) 46 at a given moment in time. The scanning movement 52 of the field lenses 40 relative to the radiation beams 44A to 44I incident on the field lenses 40 produces a corresponding scanning movement of the radiation beams 44A to 44I over the target 46.

In an embodiment, the radiation dose pattern formed on the target may be built up by tessellating a plurality of exposure segments. In an embodiment, an exposure segment is defined as the area on the target that is exposed by a group of radiation beams that are able simultaneously to pass through a single field lens during the time that that group or any member of that group passes through the single field lens. The areas A11-A14, A21-A24, and A31-A34 of FIG. 4 are examples of such exposure segments.

In an embodiment of the type shown in FIG. 6, the dose pattern formed in regions 56 may be considered to correspond to such exposure segments. The regions 56 are illuminated by radiation beams passing through a single field lens 40. The intermediate regions 58 receive radiation beams from two or more field lenses 40 and may be referred to as "stitching zones" that connect or "stitch" together different exposure segments. In an embodiment, the stitching process involves radiation beams from different field lenses contributing to the radiation dose in an overlapped manner. During the time that a radiation beam passes through the central region 61 of a field lens 40 it will tend to contribute predominantly or exclusively to a region 56. During the time that a radiation beam passes through a peripheral region 60 of a field lens 40 it will tend to contribute predominantly or exclusively to an intermediate region 58. In the example shown, it can be seen that radiation beams 44A, 44C, 44D, 44F, 44G and 44I are all incident on peripheral regions 60 of the field lenses 40 and propagate through the projection system onto intermediate regions 58. Radiation beams 44B, 44E and 44H are all incident on central regions 61 of the field lenses 40 and propagate through the projection system onto the regions 56.

In an embodiment, more radiation beams can contribute to the exposure in the intermediate regions 58. This leads to the background exposure in these regions (corresponding to a minimum lasering level) and the maximum radiation flux that can be applied (corresponding to a maximum lasering level) being higher in the regions 58 than in the regions 56.

In an embodiment, the uniformity of the performance of the apparatus is improved by compensating for the increased availability of radiation beams in certain regions of the target (e.g. regions 58) relative to other regions (e.g. regions 56). In an embodiment, an attenuator is provided that reduces the variation in maximum radiation flux that can be applied to the target by the radiation beams as a function of position on the target. In an embodiment, the standard deviation in maximum radiation flux as a function position is reduced. Reducing this variation reduces the variation in background exposure level also.

In an embodiment, the field lenses 40 are moved relative to rest of the exposure apparatus to provide the scanning of the radiation beams over the field lenses 40. In a further embodiment, the field lenses 40 are stationary and the radiation beams are scanned over the field lenses 40. This may be achieved, e.g., by moving the devices that emit the radiation beams.

In an embodiment, for example where radiation beams are scanned relative to field lenses, the attenuator may comprise a filter applied to a field lens. As discussed above with reference to FIG. 6, the radiation beams incident on the peripheral regions of the field lens tend to contribute to intermediate regions 58 where the density of radiation beams is higher. In an embodiment, the filter is configured to attenuate beams passing through peripheral regions of the field lenses more than through a central region of the field lenses.

Figure 7:
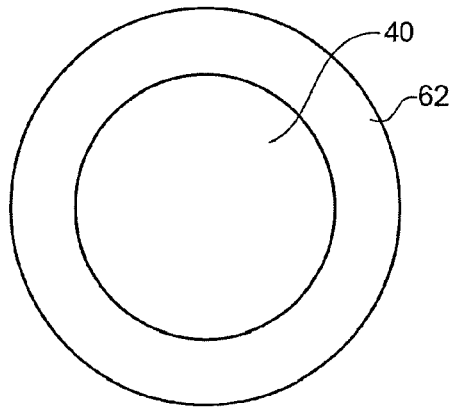
FIG. 7 depicts a field lens with a peripheral filter.

FIG. 7 is a schematic top view of a field lens 40 comprising a filter 62 formed in a peripheral region of the lens. In the example shown, the field lens 40 is circular and the filter 62 has a corresponding annular shape. In an embodiment, the field lens 40 has a different shape. In an embodiment, the filter 62 has a non-annular shape. In the embodiment shown in FIG. 7, the filter 62 has a filtering power that is substantially constant over the whole filter. In an embodiment, the filtering power of the filter varies as a function of position on the filter.

Figure 8:
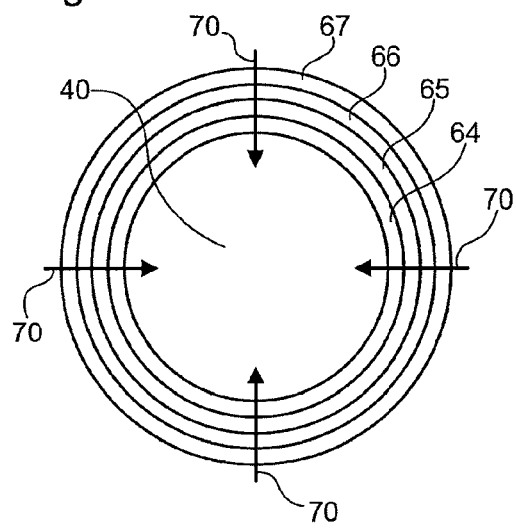
FIG. 8 depicts a field lens with a plurality of filters of different strengths.

FIG. 8 is a schematic top view of a field lens having a plurality of annular filters 64 to 67. In this embodiment, each of the different filters 64 to 67 has a different filtering power. In an embodiment, the filtering power decreases in the radially inward direction 70. In an embodiment, the filtering power of filter 67 is greater than the filtering power of filter 66, which is greater than the filtering power of filter 65, which is greater than the filtering power of filter 64. In the embodiment shown in FIG. 8, a filtering power that varies as a function of position in discrete steps is provided. In an embodiment, a filtering power that varies smoothly (continuously) as a function of position is provided. This may be achieved, for example, by depositing a spatially varying density of a substance that absorbs radiation on the surface of the lens 40.

In an embodiment, the filter power is such as to absorb 1-10% of incident radiation.

In an embodiment, the filter is formed on the field lens 40 in-situ. In an embodiment, this may be achieved by providing an environment around the field lens 40 that promotes deposition of a radiation attenuating substance on a surface exposed to radiation of a type produced by the exposure apparatus. The exposure apparatus is then controlled to expose the surface of the field lens 40 with a dose pattern suitable to deposit the desired pattern of radiation attenuating substance on the field lens 40. In areas on the field lens 40 where a larger degree of attenuation is desired, exposure to a higher level of radiation and/or exposure for a longer period of time may be performed in order to deposit a larger amount of the radiation attenuating substance. In an embodiment, the radiation attenuating substance is HxCx. In an embodiment, the wavelength of the radiation incident on the field lens 40 is 405 nm.

In an embodiment, the exposure apparatus is configured to, for a reference time period, scan a first radiation beam over a first region on a target and scan a second radiation beam over a second region on the target. In an embodiment, the area of the first region is larger than the area of the second region. In an embodiment, the attenuator is configured to attenuate the second radiation beam more than the first radiation beam during the reference time period in order to reduce the standard deviation in maximum radiation flux or background exposure level that can be applied to the target by the first and second radiation beams as a function of position on the target. An example of the first region is the area scanned by one of the beams B2 in the area A24 of FIG. 4. An example of the second region is the area scanned by one of the beams B3 in the area A34 of FIG. 4. The area of the first region is greater than the area of the second region because the beam B3 sweeps across the target at a more oblique angle than the beam B2, relative to the direction of movement of the target. The different angle of movement of the radiation beams relative to the direction of movement of the target arises because of the way in which the field lenses are moved relative to the target. The situation is illustrated schematically in FIG. 9.

Figure 9:
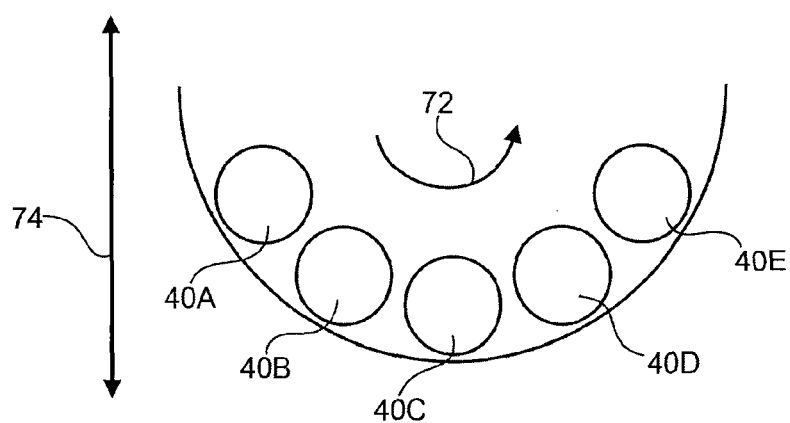
FIG. 9 depicts a plurality of field lenses mounted on a rotatable wheel.

FIG. 9 depicts schematically a portion of a rotatable frame 8 comprising field lenses 40A to 40E. The direction of movement of the target relative to the rotatable frame 8 is shown by arrow 74. The sense of rotation of the rotatable frame 8 is shown by arrow 72. In an embodiment, the programmable patterning device is configured such that radiation beams will be incident on all of the field lenses 40A-E simultaneously. Movement of the field lenses 40A-E relative to the radiation beam will cause the radiation beams to be scanned relative to the target. The scanning path will be determined by the direction of movement of the corresponding field lenses 40A to 40E. Thus, radiation beams passing through field lenses 40A, 40E which are nearer to the right or left peripheral sides of the rotatable frame 8 (relative to the page of FIG. 9) will be scanned at a more oblique angle relative to the direction of movement 74 of the target than radiation beams passing through field lenses 40B, 40C, 40D that are nearer to the central region of the rotatable frame 8. This geometry results in the density of radiation beams being higher in the regions of the target aligned with the peripheral regions of the rotatable frame 8 relative to the regions of the target aligned with the central region of the rotatable frame 8. This variation causes a corresponding variation in maximum variation flux and background exposure level that can be applied to the target by the radiation beams as a function of position.

In an embodiment, the attenuator is configured to reduce variations caused by differences in the angle between movement of the target and scanning of the radiation beams. This correction may be implemented independently of, or in conjunction with, attenuation that is applied to reduce the variation in the maximum radiation flux with position that results from the regions of overlap between areas of the target exposed by different field lenses (i.e. the regions which receive radiation from two or more field lenses 40), for example by means of filters of the geometry shown in FIG. 7 or FIG. 8.

In an embodiment, the attenuator is configured to attenuate a radiation beam passing through a field lens that is moving at a first angle, relative to the direction of movement of the target, to a greater extent than a radiation beam passing through a field lens that is moving at a second angle, relative to the direction of movement of the target. In an embodiment, the attenuator is configured to attenuate a radiation beam passing through a field lens that is moving at an angle within a first range of angles, relative to the direction of movement of the target, to a greater extent than a radiation beam passing through a field lens moving at an angle within a second range of angles, relative to the direction of movement of the target. In an embodiment, the first range of angles is the range of angles through which the field lens 40C of FIG. 9 moves while a single radiation beam passes through the lens 40C. In an embodiment, the second range of angles is the range of angles through which the field lens 40A moves while a single radiation beam passes through the lens 40A. In an embodiment, the first angle is smaller than the second angle. In an embodiment, the average angle of the first range of angles is smaller than the average angle of the second range of angles. As discussed above, the smaller the angle between the direction of scanning of the radiation beam and the direction of movement 74 of the target, the denser the resulting exposure pattern on the target for a given intensity level of the radiation beams (resulting in higher maximum radiation flux and higher background exposure). By attenuating radiation beams that are scanned at smaller angles more than radiation beams that are scanned at greater angles, the variation in maximum radiation flux and background exposure as a function of position on the target can be reduced.

Figure 10:
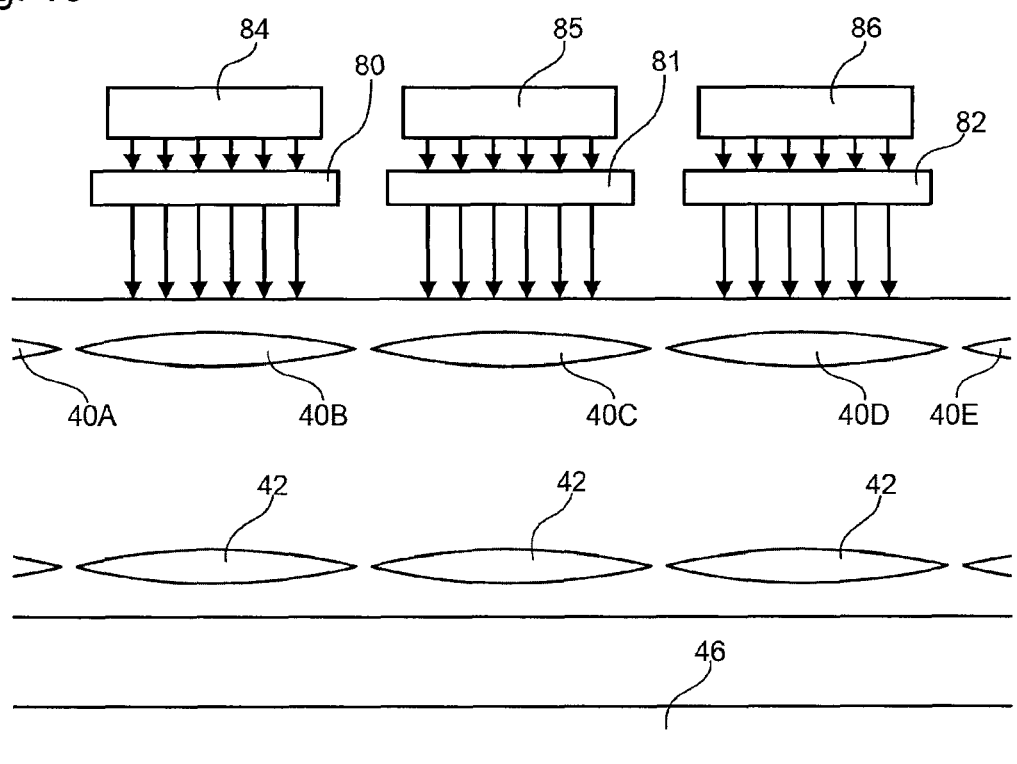
FIG. 10 depicts groups of self-emissive contrast elements, each configured to form one or more exposure segments on the target.

FIG. 10 is a schematic illustration of an embodiment in which the attenuator comprises attenuation elements 80-82 that are mounted so as to have a fixed spatial relationship relative to sources 84-86 arranged to output the radiation beams towards the field lenses 40. In the embodiment shown, each of the sources 84-86 is configured to output a plurality of radiation beams. In an embodiment, the sources 84-86 each comprise a plurality of self-emissive contrast devices. In an embodiment, the plurality of self-emissive contrast devices comprise a plurality of laser diodes. In an embodiment, the attenuation provided by each of the attenuation elements 80-82 is uniform (i.e. the same for each of the radiation beams incident on any given one of the attenuation elements). In an embodiment, the attenuation provided by one of the attenuation elements 80 is different from the attenuation provided by at least one other of the attenuation elements 81, 82. In an embodiment, the attenuation provided by at least one of the attenuation elements 80-82 is different for different ones of the radiation beams incident on that attenuation element.

The configuration of FIG. 10 could be used to implement attenuation in the context of the embodiment described with reference to FIG. 9. In an embodiment, the attenuation element 81 is positioned such that the radiation beams passing through the attenuation element 81 are incident on the field lens 40C when at the position shown in FIG. 9. In this example, the attenuation elements 80 and 82 would be effective to attenuate radiation beams passing through the field lenses 40B and 40D respectively in the positions shown in FIG. 9. In an embodiment, the attenuator elements 80 and 82 are configured to apply a higher level of attenuation than the attenuator element 81 in order to compensate for the fact that the field lenses moving underneath the attenuator elements 80 and 82 will be moving at a more oblique angle (less nearly at 90 degrees) relative to the direction of movement 74 of the target than the field lenses moving underneath the attenuator element 81.

In accordance with a device manufacturing method, a device, such as a display, integrated circuit or any other item may be manufactured from the substrate on which the pattern has been projected.

In accordance with a device manufacturing method, a device, such as a display, integrated circuit or any other item may be manufactured from the substrate on which the pattern has been projected.

Although specific reference may be made in this text to the use of lithographic or exposure apparatus in the manufacture of ICs, it should be understood that the lithographic or exposure apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

The descriptions above are intended to be illustrative, not limiting. Thus, it will be apparent to one skilled in the art that modifications may be made to the invention as described without departing from the scope of the claims set out below.

The invention claimed is:

1. An exposure apparatus comprising:
   a programmable patterning device configured to provide individually controllable radiation beams;
   a projection system comprising field lenses and configured to project each of the individually controllable radiation beams through the field lenses onto a target to produce a radiation dose pattern on the target, the radiation dose pattern comprising;
   a first region having a first radiation dose from a radiation beam of the individually controllable radiation beams traversing through one of the field lenses, and a second region having a second radiation dose from radiation beams of the individually controllable radiation beams traversin through two or more of the field lenses; and
an attenuator configured to reduce a standard deviation in a maximum radiation flux or a background exposure level in the second region on the target.

2. The exposure apparatus according to claim 1,
wherein the attenuator is further configured to attenuate the radiation beams traversing through the two or more of the field lenses more than the radiation beam traversing through the one of the field lenses.

3. The exposure apparatus according to claim 1, wherein the projection system is further configured to:
direct each of the individually controllable radiation beams onto a respective one of locations on the target; and
control a respective position of each of the individually controllable radiation beams relative to a field lens of the field lenses.

4. The exposure apparatus according to claim 3, wherein the projection system comprises imaging lenses.

5. The exposure apparatus according to claim 1, wherein:
exposure segments comprise areas on the target exposed by a group of radiation beams of the individually controllable radiation beams traversing simultaneously through the one of the field lenses; and
the attenuator is further configured to attenuate a radiation beam of the individually controllable radiation beams that contribute to a region of overlap between two or more of the exposure segments.

6. The exposure apparatus according to claim 1, wherein the attenuator comprises a filter applied to one or more of the field lenses.

7. The exposure apparatus according to claim 6, wherein the filter is configured to have a stronger filtering property in a radially peripheral region of the field lenses than in a radially central region of the field lenses.

8. The exposure apparatus according to claim 1, wherein the target is configured to move linearly relative to the projection system.

9. The exposure apparatus according to claim 8, wherein:
the attenuator is further configured to attenuate a first radiation beam of the individually controllable radiation beams more than a second radiation beam of the individually controllable radiation beams;
the first radiation beam passes through a first one of the field lenses moving at a first angle or through a first range of angles relative to the direction of linear movement of the target; and
the second radiation beam passes passing through a second one of the field lenses moving at a second angle or through a second range of angles relative to the direction of linear movement of the target.

10. The exposure apparatus according to claim 9, wherein the first angle is smaller than the second angle.

11. The exposure apparatus according to claim 9, wherein an average angle of the first range of angles is smaller than an average angle of the second range of angles.

12. The exposure apparatus according to claim 1, further comprising a rotatable frame configured to provide a relative movement between the individual controllable radiation beams and the field lenses, the field lenses being mounted on the rotatable frame.

13. The exposure apparatus according to claim 1, wherein the programmable patterning device comprises a plurality of self-emissive contrast elements.

14. The exposure apparatus according to claim 13, wherein each of the self-emissive contrast elements of the plurality of self-emissive contrast elements are nominally identical to each other.

15. The exposure apparatus according to claim 13, wherein each of the self-emissive contrast elements of the plurality of self-emissive contrast elements comprises a laser diode.

16. A device manufacturing method comprising:
providing, using a programmable patterning device, individually controllable radiation beams;
projecting, using a projection system, each of the individually controllable radiation beams through field lenses onto a target;
producing, using the projection system, a radiation dose pattern on the target, the producing comprising:
forming a first region of the radiation dose pattern having a first radiation dose from a radiation beam of the individually controllable radiation beams traversing through one of the field lenses, and
forming a second region of the radiation dose having a second radiation dose from radiation beams of the individually controllable radiation beams traversing through two or more of the field lenses; and
reducing, using an attenuator, a standard deviation in a maximum radiation flux or a background exposure level in the second region.

17. The device manufacturing method according to claim 16, further comprising attenuating the radiation beam traversing through the one of the field lenses more than the radiation beams traversing through the two or more of the field lenses.

18. The device manufacturing method according to claim 16, further comprising controlling a respective position of each of the individually controllable radiation beams relative to a field lens of the field lenses.

19. An exposure apparatus comprising:
a programmable patterning device configured to provide individually controllable radiation beams;
a projection system comprising field lenses and configured to project each of the individually controllable radiation beams onto a respective location on a target; and
an attenuator configured to:
attenuate a first radiation beam of the individually controllable radiation beams more than a second radiation beam of the individually controllable radiation beams, wherein:
the first radiation beam passes through a first one of the field lenses moving at a first angle or through a first range of angles relative to a direction of linear movement of the target, and
the second radiation beam passes through a second one of the field lenses moving at a second angle or through a second range of angles relative to the direction of linear movement of the target; and
reduce a standard deviation in a maximum radiation flux or a background exposure level that can be applied to the target by the individually controllable radiation beams as a function of position on the target.

* * * * *